United States Patent
Spandre

(10) Patent No.: US 7,256,130 B2
(45) Date of Patent: Aug. 14, 2007

(54) PROCESS FOR DEFINING A CHALCOGENIDE MATERIAL LAYER, IN PARTICULAR IN A PROCESS FOR MANUFACTURING PHASE CHANGE MEMORY CELLS

(75) Inventor: Alessandro Spandre, Pavia (IT)

(73) Assignees: STMicroelectronics S.r.l., Agrate Brianza (IT); OVONYX, Inc., Boise, ID (US)

(*) Notice: Subject to any disclaimer, the term of this patent is extended or adjusted under 35 U.S.C. 154(b) by 0 days.

(21) Appl. No.: 10/837,491

(22) Filed: Apr. 30, 2004

(65) Prior Publication Data

US 2005/0032374 A1 Feb. 10, 2005

(30) Foreign Application Priority Data

May 7, 2003 (EP) .................. 03425293

(51) Int. Cl.
*H01L 21/302* (2006.01)
*H01L 21/461* (2006.01)

(52) U.S. Cl. .................. 438/710; 438/705; 438/714; 438/745; 437/23

(58) Field of Classification Search ................ 438/710, 438/689
See application file for complete search history.

(56) References Cited

U.S. PATENT DOCUMENTS

| 4,320,191 A | 3/1982 | Yoshikawa et al. ......... 430/296 |
| 4,506,005 A | 3/1985 | Lis .............................. 430/317 |
| 5,215,929 A * | 6/1993 | Okawa et al. ................ 438/44 |
| 6,077,777 A | 6/2000 | Ha .............................. 438/652 |
| 6,251,568 B1 * | 6/2001 | Hsia et al. ................... 430/325 |
| 6,448,576 B1 * | 9/2002 | Davis et al. .................. 257/50 |
| 6,537,918 B2 * | 3/2003 | Ionov et al. ................ 438/710 |
| 6,657,247 B2 * | 12/2003 | Yoshiyama et al. ......... 257/303 |
| 2002/0129900 A1 * | 9/2002 | Yoshioka et al. ...... 156/345.31 |
| 2003/0047727 A1 | 3/2003 | Chiang ........................ 257/3 |

FOREIGN PATENT DOCUMENTS

| EP | 0 386 518 A1 | 9/1990 |
| EP | 0 456 479 A2 | 11/1991 |
| EP | 0 987 745 A1 | 3/2000 |

OTHER PUBLICATIONS

J. W. Lee et al. J. Vac. Sci. Technol. A 16(3), May 1998 (pp. 1944-1948), Electron Cyclotron Resonace Plasma Etching of Oxides and SrS and ZnS-based Electroluminescent Materials for Flat Panel Displays.*

(Continued)

Primary Examiner—Nadine Norton
Assistant Examiner—Mahmoud Dahimene
(74) Attorney, Agent, or Firm—Lisa K. Jorgenson; Hai Han; Seed IP Law Group PLLC

(57) ABSTRACT

A process for defining a chalcogenide material layer using a chlorine based plasma and a mask, wherein the portions of the chalcogenide material layer that are not covered by the mask are etched away. In a phase change memory cell having a stack of a chalcogenide material layer and an AlCu layer, the AlCu layer is etched first using a chlorine based plasma at a higher temperature; then the lateral walls of the AlCu layer are passivated; and then the chalcogenide material layer is etched at a lower temperature.

28 Claims, 2 Drawing Sheets

OTHER PUBLICATIONS

S. Wolf and R.N. Tauber, Silicon Processing for the VLSI Era, vol. 1- Process Technology, Lattice Press, 1986, p. 563□□.*

Aznarez, J. et al., "Bi-Level Image Recording in Te-Ge Thin Films," *The Journal of Photographic Science* 35:61-65, 1987.

Bacher, G. et al., "ZnSe-based DBR-laser Diode," *Electronics Letters* 31(25):2184-2185, Dec. 1995.

Gupta, P. et al., "Plasma-processed Positive and Negative Resist Behavior of Obliquely Deposited Amorphous P-Se Films," *J. Vac. Sci. Technol.* 3(6):1590-1593, Nov./Dec. 1985.

* cited by examiner

PROCESS FOR DEFINING A CHALCOGENIDE MATERIAL LAYER, IN PARTICULAR IN A PROCESS FOR MANUFACTURING PHASE CHANGE MEMORY CELLS

BACKGROUND OF THE INVENTION

1. Field of the Invention

The present invention relates to a process for defining a chalcogenide material layer, in particular in a process for manufacturing phase change memory cells.

2. Description of the Related Art

As is known, phase change memory cells utilize a class of materials that have the unique property of being reversibly switchable from one phase to another with measurable distinct electrical properties associated with each phase. For example, these materials may change between an amorphous disordered phase and a crystalline, or polycrystalline, ordered phase. A material property that may change and provide a signature for each phase is the material resistivity, which is considerably different in the two states. Thus a thin film of chalcogenic material may be employed as a programmable resistor, switching between a high and a low resistance condition.

The phase of a chalcogenide material may be modified by passing electrical currents of suitable values for preset times. Furthermore, the state of the chalcogenic material may be read by applying a sufficiently small voltage (or current) so as not to cause an appreciable heating and measuring the current passing through it (or voltage across it). Since the current is proportional to the conductance (or voltage is proportional to the resistance) of the chalcogenic material, it is possible to discriminate between the two phases.

Thus, the use of chalcogenide materials has been already proposed for making phase change memory cells.

At present, alloys of elements of group VI of the periodic table, such as Te or Se, referred to as chalcogenides or chalcogenic materials, can advantageously be used in phase change memory cells. The currently most promising chalcogenide is formed by a Ge, Sb and Te alloy ($Ge_2Sb_2Te_5$), also called GST, which is currently widely used for storing information in overwritable disks.

The basic structure of a PCM element 1 is shown in FIG. 1 and comprises a first electrode 2 of resistive type, forming a heater; a programmable element 3, in contact with the first electrode 2; and a second electrode 5 of a metal material, for example AlCu. A barrier layer 4, for example of Ti/TiN, is generally arranged between the programmable element 3 and the second electrode 5.

Definition of the programmable element 3, barrier layer 4 and the second electrode 5 gives rise to some difficulties.

Presently, chalcogenic materials are mainly used in microelectronic field to improve the definition of structures in the substrate. For example, chalcogenide layers are used in addition to lithographic masks and act directly as masking layers since they have particular properties with regards to photosensitivity and photolithographic development. In the alternative, the ability of the chalcogenic material is exploited to form compounds that are particularly reactive with the substrate to be defined, both with regards to plasma etching and etching in aqueous e/o organic solution. The multilayer obtained by depositing the chalcogenic material on the substrate to be defined is exposed to a radiation through a standard lithographic mask, which defines only the areas where the substrate is to be exposed. The reaction between the remaining chalcogenic material and the substrate forms a third component that is more reactive to a wet or plasma etching. The chemicals used for plasma etching include fluorinated gases, such as $CF_4$, $CHF_3$, $C_2F_8$, $CClF_3$ or mixtures of $O_2$, $N_2$, and Ar.

As said, in all cases cited in literature the chalcogenic layer is used to define the underlying substrate and not as the layer to be defined to form an active region. Furthermore, the chemicals used (as said, based on fluorinated gases or mixtures of $O_2$, $N_2$, and Ar) are not compatible with metal layers of AlCu, Ti and TiN. Although the fluorinated gases are able to etch the AlCu layer, the reaction speed is low. Moreover, from tests made by the applicant, it was noted that the structures of AlCu, after being exposed to a $CF_4$ plasma for some tens of seconds, present holes in the lower part, due to an overetching by fluorine. A $CF_4$ plasma also etches TiN heavily on the upper part of the structure.

Thus, presently no satisfying etching is available for the definition of GST layers used in microelectronics and thus forming active portions of an integrated semiconductor device.

BRIEF SUMMARY OF THE INVENTION

One embodiment the invention provides a process for defining a chalcogenide material layer in the manufacture of a semiconductor integrated device, by dry etching the chalcogenide material layer using a chlorine based plasma.

BRIEF DESCRIPTION OF THE DRAWINGS

For the understanding of the present invention, a preferred embodiment is now described, purely as a non-limitative example, with reference to the enclosed drawings, wherein.

DETAILED DESCRIPTION OF THE INVENTION

According to one embodiment of the invention, a GST layer is dry etched using a gas mixture based on chlorine, typically a mixture of $Cl_2$ and $BCl_3$. Etching tests made on GST layers showed very high etching speeds and very reproducible and reliable profiles.

According to another embodiment of the invention, the same chemical mixture may be used to etch a stack including a metal layer overlying a GST layer, using an integrated etching technique and thus the same etching chamber for all the layers. Thereby, defectivity may be reduced.

In microelectronics, layers of AlCu are routinely plasma etched using gaseous mixtures of $Cl_2$ and $BCl_3$ since this solution gives the better results in terms of profile precision and etching speed. $Cl_2$ reacts with Al to form $AlCl_3$, which is a very volatile compound that may be easily removed from the substrate during the etching. However, the use of a solution including $Cl_2$ has the disadvantage that defined structures of AlCu are sensible to corrosion in the presence of humidity. If the residuals of $AlCl_3$ adsorbed on the wall of the AlCu structure after etching are not removed, they can trigger corrosion that destroys the entire structure. Removal of these residuals is thus realized by using a water vapor plasma, a process called passivation. Passivation is carried out in a separate chamber that is connected to the etching chamber to avoid any contact with the atmosphere.

However, a stack including GST and AlCu cannot be etched using standard conditions, that is, carrying out a single etch through the complete stack, then passivating the AlCu structure and removing the resist, since tests have shown that the AlCu etching cannot be completely controlled, thereby loses anisotropy and causes a lateral etching of the structure. In some cases, the lateral etching can even cause destruction of the structure, causing the underlying layers to collapse. To solve this problem, according to a further aspect of the invention, the AlCu layer is passivated before etching the underlying layers. Advantageously, the further etching of the GST layer is carried out at a lower temperature.

A further improvement to obtain a greater control of the profile and avoid lateral overetching is obtained adding Ar, $O_2$ and $N_2$ to the etching plasma. Conveniently, Ar dilutes $Cl_2$ and helps in avoiding a lateral overetching of the GST layer. $N_2$ and $O_2$ form a protective layer of on GST lateral wall.

Figure 1:
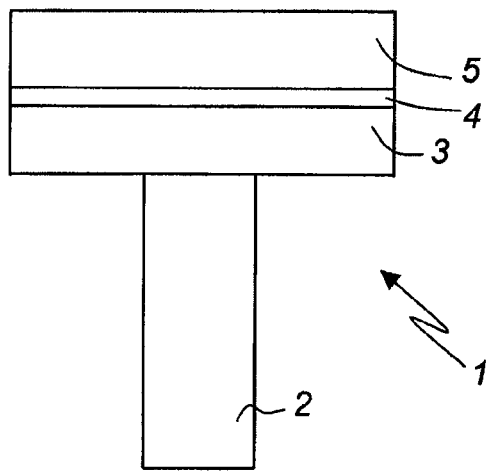
FIG. 1 shows the basic structure of a known chalcogenic element.

An embodiment of an etching process for a multilayer stack including AlCu and GST usable in a phase change memory cell 1 as shown in FIG. 1 will be described hereinafter, with reference to FIGS. 2-5 and 6a-6g.

Figure 2:
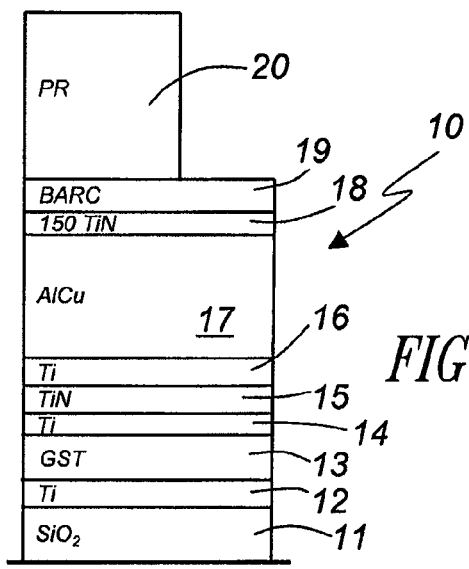
FIGS. 2-5 shows a stack including a GST layer in subsequent process steps.
Figure 6A:
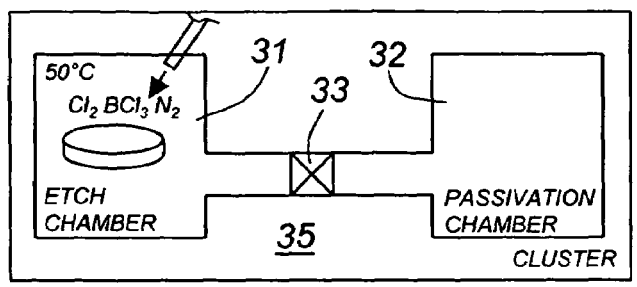
FIGS. 6a-6g are schematical views of the plant used for carrying out the process according to the invention.

First, FIG. 2, a stack 10 is deposited on a substrate, according to standard techniques. The stack and the substrate are part of a wafer 30 (FIG. 6a). As shown, the stack 10 comprises, from below, an oxide layer 11, e.g., 200 nm; a first Ti layer 12, e.g., 20 nm; a GST layer 13, e.g., 60 nm; a second Ti layer 14, e.g., 5 nm; a first TiN layer 15, e.g., 20 nm; a third Ti layer 16, e.g., 10 nm; an AlCu layer 17, e.g., 220 nm; a second TiN layer 18, e.g., 15 nm; and a bottom anti-reflecting coating layer (also called BARC layer 19), e.g., 60 nm.

In the stack 10, the Ti layers 12, 14, 16 have the aim of improving the adhesion of the overlaying layer to the underlying layer; the first TiN layer 15 is intended to act as a barrier between AlCu layer 17 and the GST layer 13, the second TiN layer 18 has an anti-reflecting goal; the BARC layer 19 is for example an organic polymeric compound.

Then a resist mask 20 is formed over the stack 10, according to the structure to be defined, in a per se known manner.

Figure 3:
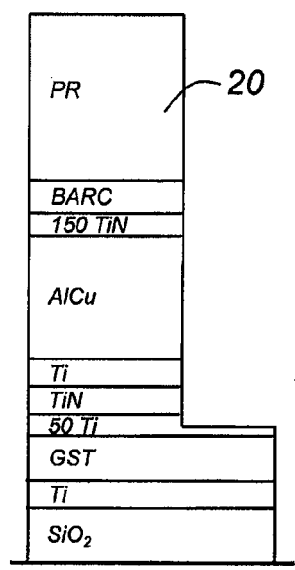

Then, the wafer 30 including the stack 10 is brought in an etching chamber 31 belonging to a cluster 35, as shown in FIG. 6a, and a first etching step is carried out. The first etching uses a plasma fed by $Cl_2$, $BCl_3$ and $N_2$ and is carried out at a temperature between 45° C. and 55° C., preferably 50° C. Thus, in sequence, the BARC layer 19, the second TiN layer 18, the AlCu layer 17, the third Ti layer 16, the first TiN layer 15 and part of the second Ti layer 14 are selectively removed. The structure of FIG. 3 is thus obtained.

Figure 6B:
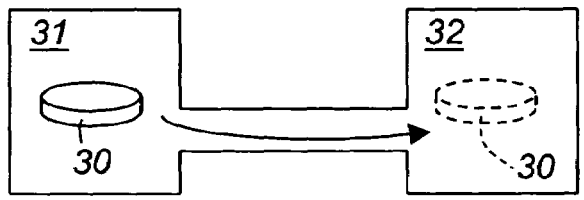

Then, as shown in FIG. 6b, the wafer 30 is moved in a passivation chamber 32 of the same cluster 35. The passivation chamber 32 is separated from etching chamber 31 but is connected thereto so as to avoid any contact with the atmosphere. The separation between etching chamber 31 and passivation chamber 32 is shown schematically in FIG. 6a by a diaphragm 33 that is open and thus not shown in FIG. 6b.

Figure 6C:
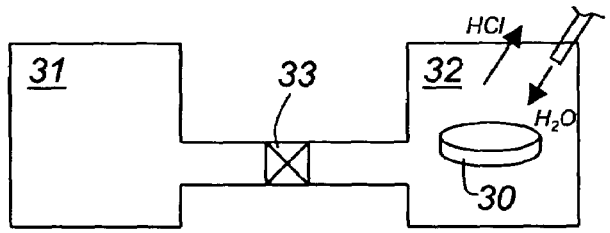

In the passivation chamber 31, the wafer 30 is submitted to a water vapor plasma, FIG. 6c. Thereby a protective layer of aluminum oxide ($Al_2O_3$) is formed on the lateral wall of the AlCu layer 17; furthermore, the adsorbed $Cl_2$ (which reacts with the hydrogen in the water and forms HCl) and the remaining $AlCl_3$ are removed.

Figure 4:
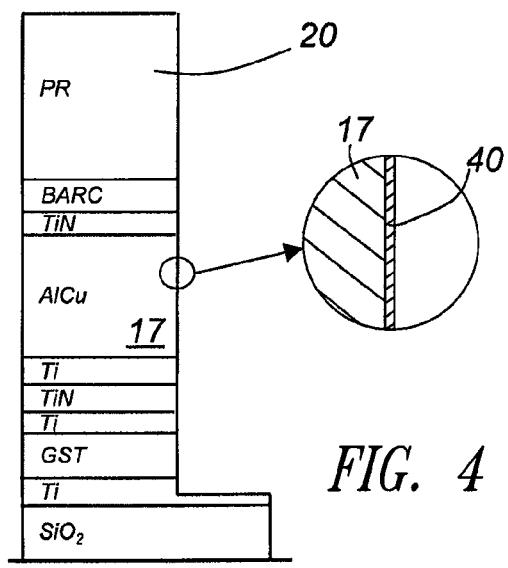

Thereby, a thin passivation layer 40 of aluminum oxide ($Al_2O_3$) is formed on the lateral sides of the AlCu layer 17, as shown schematically in the enlarged detail of FIG. 4.

Figure 6D:
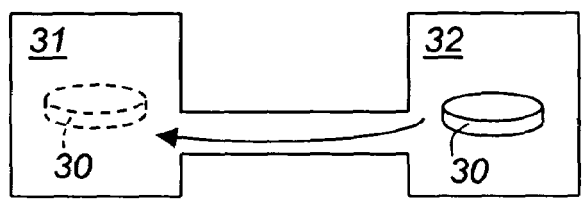
Figure 6E:
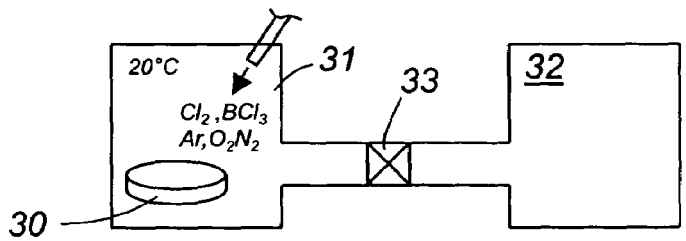

Then, the wafer 30 is transferred back to the etching chamber 31, FIG. 6d and subject to a second etching step, FIG. 6e.

Here, using the same mask 20, the bottom portion of the second Ti layer 14, the GST layer 13 and an upper portion of the first Ti layer 12 are etched using a $Cl_2$, $BCl_3$, Ar, $O_2$ and $N_2$ plasma at a temperature comprised between 20° C. and 35° C., preferably 20° C. The etching agents are $Cl_2$, $BCl_3$; Ar, $O_2$ and $N_2$ are added to ensure the best obtainable verticality of the GST layer 13. In particular, Ar has the aim of diluting chlorine and avoid overetching the GST layer 13 wall. Oxygen has the aim of oxidizing the exposed chalcogenic material as the etching proceeds. Oxidation of the chalcogenic material is thermodynamically favored and the reaction speed is very high. The oxide formed during the etching is inert to the overetching due to $Cl_2$. During etching, stable and volatile chlorides of Ge, Sb and Te are formed; these chloride allow reaction to go on since they may easily be removed from the substrate. In this step, the AlCu layer 17 is protected by the thin passivation layer 40.

Thus, the structure of FIG. 4 is obtained.

Figure 5:
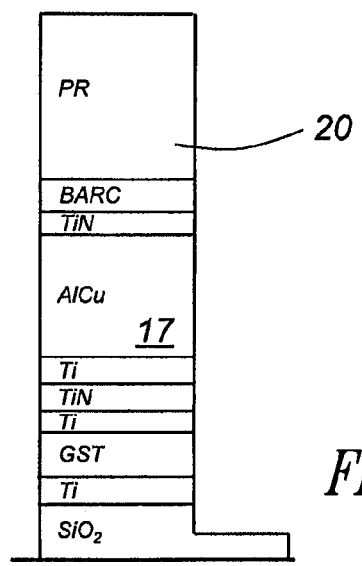
Figure 6F:
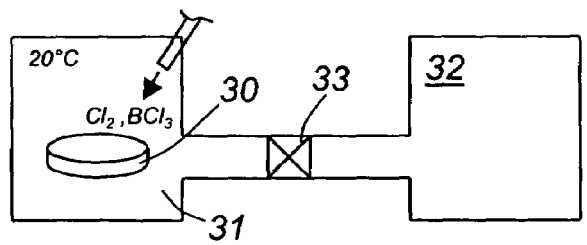
Figure 6G:
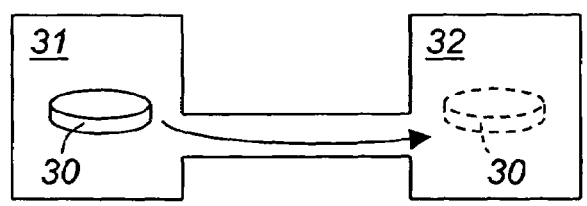

Thereafter, as shown in FIG. 6f, the bottom portion of the first Ti layer 12 and a top portion of the oxide layer 11 are dry etched using $Cl_2$, $BCl_3$ at a temperature between 20° C. and 35° C., preferably 20° C. Partial removal of the oxide layer 11 is necessary to ensure electrical insulation of the remained stack from other adjacent structures (not shown). The resulting structure is shown in FIG. 5.

Finally, the wafer 30 is transferred back to the passivation chamber 32 (FIG. 6g), where any chlorine residual that may trigger corrosion and destroy the defined structures is removed. Here, the mask 20 is also removed using an oxygen plasma.

The advantages of the present invention are clear from the above. In particular, it is outlined that the use of a chlorine plasma allows etching of a GST layer with a high etching speed and very good profile. Tests have shown that chlorine based gases give a better selectivity than the fluorinated gases used in prior art processes.

The etching chemicals are compatible with other metal layers used in microelectronics. This is very advantageous, since on the one hand there is no risk of damage of other structures and layers in a same wafer and on the other hand it is possible to carry out integrated etching, using a same etching chamber, thus reducing the defects due to the use of different etch tools.

The use of a metal etching tool including a passivation chamber is very advantageous to protect any metal structure or layer against corrosion.

The temperature reduction during etching of the chalcogenic layer with respect to the temperature used for etching the metal layer is very advantageous in preserving the integrity and the desired profile for the multilayer structure.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Finally, it is clear that numerous variations and modifications may be made to the process described and illustrated herein, all falling within the scope of the invention as defined in the attached claims.

In particular, it is underlined that the present process is easily implemented in defining a phase change memory cell of the type shown in FIG. 1.

The invention claimed is:

1. A process for defining a chalcogenide material layer in the manufacture of a semiconductor integrated device, comprising the steps of:
    forming a stack including said chalcogenide material layer and a metal layer positioned above the chalcogenide material layer;
    forming a mask covering the metal layer;
    etching the metal layer through the mask using a chlorine based plasma; and
    dry etching said chalcogenide material layer through the mask using a chlorine based plasma, wherein said step of etching said metal layer is carried out at a first temperature and said step of dry etching is carried out at a second temperature that is lower than said first temperature.

2. A process according to claim 1 wherein said step of dry etching comprises:
    etching portions of said chalcogenide material layer using a chlorine and oxygen based plasma.

3. A process according to claim 1, wherein said mask is a photoresist mask.

4. A process according to claim 1 wherein said chlorine based plasma comprises $Cl_2$ and $BCl_3$.

5. A process according to claim 1, wherein said chlorine based plasma comprises at least one gas selected from the group consisting of Ar, $O_2$ and $N_2$.

6. A process according to claim 1 wherein said chalcogenide material layer is directly covered by an adhesion layer that is under the metal layer, the process comprising, before said step of dry etching said chalcogenide layer, defining said metal layer and at least part of said adhesion layer using a chlorine based plasma.

7. A process according to claim 6 wherein said metal layer comprises AlCu.

8. A process according to claim 1 wherein said metal layer is a multi-layer of AlCu, Ti and TiN.

9. A process according to claim 1, wherein said first temperature is between 45° C. and 55° C. and said second temperature is between 20° C. and 35° C.

10. A process according to claim 1, comprising, after said step of etching said metal layer and before said step of dry etching said chalcogenide layer, passivating said metal layer by forming a passivation layer on lateral walls of the metal layer.

11. A process according to claim 10 wherein said step of forming a passivation layer comprises forming an oxide layer on the lateral walls of said metal layer.

12. A process according to claim 1 wherein said step of etching the metal layer comprises etching the metal layer in an etching chamber of a cluster, the process further comprising:
    moving a wafer comprising said chalcogenide material layer and said metal layer from the etching chamber to a passivation chamber of the cluster without exposing the wafer to the atmosphere;
    passivating said metal layer using a water vapor plasma in the passivation chamber, the passivating step forming a passivation layer on lateral walls of the metal layer; and
    moving back said wafer from said passivation chamber to said etching chamber, wherein the dry etching step includes dry etching the chalcogenide material layer in the etching chamber.

13. A process according to claim 12 wherein said cluster includes a diaphragm between said etching chamber and said passivation chamber.

14. A process according to claim 12 wherein said step of passivating said metal layer produces volatile byproducts, and said step of passivating further comprises the step of removing said volatile byproducts.

15. A process for defining a chalcogenide material layer in the manufacture of a semiconductor integrated device, comprising the steps of:
    forming a stack including said chalcogenide material layer and a metal layer positioned above the chalcogenide material layer;
    forming a mask covering the metal layer;
    etching the metal layer through the mask using a chlorine based plasma; and
    dry etching said chalcogenide material layer though the mask using a chlorine based plasma, wherein said step of dry etching is carried out at a temperature between 20° C. and 35° C.

16. A process according to claim 15 wherein said step of dry etching is carried out at 20° C.

17. A process for defining a wafer having a chalcogenide material layer and a metal layer, comprising:
    dry etching said metal layer using a first chlorine based plasma at a first temperature;
    passivating said metal layer using a water vapor plasma; and
    dry etching said chalcogenide material layer after said passivating step using a second chlorine based plasma at a second temperature, wherein said first temperature is higher than said second temperature.

18. The process according to claim 17 wherein said first chlorine based plasma comprises $Cl_2$, $BCl_3$ and $N_2$.

19. The process according to claim 17 wherein said second chlorine based plasma comprises $Cl_2$, $BCl_3$ and $O_2$.

20. A process according to claim 17, wherein said first temperature is between 45° C. and 55° C. and said second temperature is between 20° C. and 35° C.

21. A process for defining a chalcogenide material layer in the manufacture of a semiconductor integrated device, comprising the steps of:
    providing said chalcogenide material layer; and
    dry etching said chalcogenide material layer using a plasma that includes chlorine and oxygen gases,
    wherein the process further comprising:
    forming a stack including said chalcogenide material layer and a metal layer positioned above the chalcogenide material layer;
    forming a mask covering metal layer; and
    etching the metal layer through the mask, wherein the dry etching step includes dry etching said chalcogenide material layer through the mask using the plasma that includes chlorine and oxygen gases, wherein said step of etching said metal layer is carried out at a first temperature and said step of dry etching is carried out at a second temperature that is lower than said first temperature.

22. A process according to claim 21, wherein said mask is a photoresist mask.

23. A process according to claim 21 wherein said chalcogenide material layer is directly covered by an adhesion layer that is under the metal layer, the process comprising, before said step of dry etching said chalcogenide layer, defining said metal layer and at least part of said adhesion layer using a chlorine based plasma.

24. A process according to claim 21 wherein said metal layer is a multi-layer of AlCu, Ti and TiN.

25. A process according to claim 21, wherein said first temperature is between 45° C. and 55° C. and said second temperature is between 20° C. and 35° C.

26. A process according to claim 21, comprising, after said step of etching said metal layer and before said step of dry etching said chalcogenide layer, passivating said metal layer by forming a passivation layer on lateral walls of the metal layer.

27. A process according to claim 26 wherein said step of forming a passivation layer comprises forming an oxide layer on the lateral walls of said metal layer.

28. A process according to claim 21 wherein said step of etching the metal layer comprises etching the metal layer in an etching chamber of a cluster, the process further comprising:
- moving a wafer comprising said chalcogenide material layer and said metal layer from the etching chamber to a passivation chamber of the cluster without exposing the wafer to the atmosphere;
- passivating said metal layer using a water vapor plasma in the passivation chamber, the passivating step forming a passivation layer on lateral walls of the metal layer; and
- moving back said wafer from said passivation chamber to said etching chamber, wherein the dry etching step includes dry etching the chalcogenide material layer in the etching chamber.

* * * * *